(12) United States Patent
Mathur (10) Patent No.: US 10,727,825 B2
(45) Date of Patent: Jul. 28, 2020

(54) CIRCUITS FOR OPTIMIZING SKEW AND DUTY CYCLE DISTORTION BETWEEN TWO SIGNALS

(71) Applicant: SanDisk Technologies LLC, Plano, TX (US)

(72) Inventor: Shiv Harit Mathur, Bangalore (IN)

(73) Assignee: SanDisk Technologies LLC, Addison, TX (US)

( * ) Notice: Subject to any disclaimer, the term of this patent is extended or adjusted under 35 U.S.C. 154(b) by 416 days.

(21) Appl. No.: 15/626,627

(22) Filed: Jun. 19, 2017

(65) Prior Publication Data

US 2018/0302074 A1 Oct. 18, 2018

(30) Foreign Application Priority Data

Apr. 12, 2017 (IN) .............................. 201741013099

(51) Int. Cl.
*H03K 5/156* (2006.01)
*H03K 5/151* (2006.01)

(52) U.S. Cl.
CPC ......... *H03K 5/1565* (2013.01); *H03K 5/1515* (2013.01)

(58) Field of Classification Search
CPC ....... H03K 5/1515; H03K 5/1565; G06F 1/10
See application file for complete search history.

(56) References Cited

U.S. PATENT DOCUMENTS

| 5,365,128 A * | 11/1994 | Bazes ................... H03K 5/133 327/141 |
|---|---|---|
| 5,900,752 A | 5/1999 | Mar |
| 6,417,711 B2 | 7/2002 | Fulkerson |
| 6,433,598 B1 | 8/2002 | Schultz |
| 6,556,048 B1 | 4/2003 | Dunne |
| 6,958,627 B2 | 10/2005 | Singh et al. |
| 7,119,602 B2 | 10/2006 | Davis |
| 7,196,550 B1 * | 3/2007 | Reinschmidt .... H03K 3/356104 326/113 |
| 7,424,650 B1 | 9/2008 | Sivadasan et al. |
| 7,777,521 B2 | 8/2010 | Hanna et al. |
| 2006/0066377 A1 * | 3/2006 | Davis ....................... G06F 1/10 327/295 |

* cited by examiner

*Primary Examiner* — Terrell S Johnson
(74) *Attorney, Agent, or Firm* — Vierra Magen Marcus LLP (57) ABSTRACT

A circuit system may include a first stage circuit configured to generate two pairs of signals in response to an input signal. The circuit system may also include a second stage circuit that is configured to combine a first signal of a first pair with a first signal of a second pair to generate a first combined signal, and to combine a second signal of the first pair with a second signal of the second pair to generate a second combined signal. Transistors of the second stage circuit may be sized in relation to transition timings of the first and second pairs of signals such that skew and duty cycle distortion is minimized between the first and second combined signals.

20 Claims, 6 Drawing Sheets

CIRCUITS FOR OPTIMIZING SKEW AND DUTY CYCLE DISTORTION BETWEEN TWO SIGNALS

CROSS-REFERENCE TO RELATED APPLICATIONS

This application claims priority to Indian Patent Application No. 201741013099, filed Apr. 12, 2017. The contents of Indian Patent Application No. 201741013099 are incorporated by reference in their entirety.

BACKGROUND

Some circuit systems may generate and transmit a signal as a balanced pair of signals in order to remove common-mode noise from the signal. In particular configurations, the balanced pair may be a complementary or differential pair of signals.

Each signal in the balanced pair may transition between at least two voltage levels, such as a high voltage level and a low voltage level. Depending on the application, it may be desirable for the timing characteristics of the two signals of the pair to match or be in as close of alignment as possible. One timing characteristic may be duty cycle. That is, it may be desirable for the two signals to have as close to the same duty cycle as possible. Another timing characteristic may be transition time, which is the time that a signal transitions from one voltage level to another voltage level. The difference in time between when two signals perform respective transitions may be referred to as skew.

It may be desirable for two signals to perform respective transitions at the same time or as close to the same time as possible. Otherwise stated, it may be desirable for the two signals to have as little skew between them as possible. Minimum skew may be especially desirable in double date rate (DDR) signaling schemes where information is communicated on both the rising edges and the falling edges of a signal.

Circuit systems that communicate a pair of signals with desirably as little skew as possible may include a de-skew circuit. As performance characteristics for electronic devices continually require higher data rates, reduced power consumption, smaller sizes, and less susceptibility to process, variation, and temperature (PVT) variations, improved de-skew circuits that meet these requirements may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Overview

The following embodiments describe a circuit configured to optimize for skew and duty cycle distortion between two signals. In one embodiment a circuit includes a first stage circuit and a second stage circuit. The first stage circuit is configured to receive an input signal, and in response to the input signal generate a first pair of signals and a second pair of signal. The first pair includes a first early-transitioning signal and a first late-transitioning signal. The second pair includes a second early-transitioning signal and a second late-transitioning signal. The second stage circuit is configured to combine the first early-transitioning signal with the second late-transitioning signal to generate a first combined signal, and combine the first late-transitioning signal and the second early-transitioning signal to generate a second combined signal.

In some embodiments, the first stage circuit includes: a chain of inverters configured to generate the first pair of signals; and a pass gate and an inverter configured to generate the second pair of signals.

In some embodiments, an output of the chain of inverters is uncoupled from an output of the pass gate.

In some embodiments, the second stage circuit includes: a coupled inverter circuit configured to: invert the first early-transitioning signal to generate an inverted first early-transitioning signal; invert the second late-transitioning signal to generate an inverted second late-transitioning signal; and combine the inverted first early-transitioning signal and the inverted second late-transitioning signal to generate the first combined signal.

In some embodiments, the second stage circuit further includes a coupled inverter circuit configured to: invert the first late-transitioning signal to generate an inverted first late-transitioning signal; invert the second early-transitioning signal to generate an inverted second early-transitioning signal; and combine the inverted first late-transitioning signal and the inverted second early-transitioning signal to generate the second combined signal.

In some embodiments, the circuit further includes a third stage circuit comprising a pair of cross-coupled inverters configured to receive the first combined signal and the second combined signal; and generate a pair of cross-coupled signals based on the first combined signal, the second combined signal, and cross-coupling of the pair of cross-coupled inverters.

In some embodiments, transistors of the second stage circuit are sized according to relative transition timing of the first early-transitioning signal, the first late-transitioning signal, the second early-transitioning signal, and the second late-transitioning signal.

In some embodiments, the first pair of signals are complementary signals and the second pair of signals are complementary signals.

In some embodiments, the first combined signal and the second combined signal are complementary signals.

In another embodiment, a circuit includes a first circuit and a second circuit. The first circuit is configured to receive a first signal of a first pair of complementary signals and a first pair of a second pair of complementary signals, and combine the first signal of the first pair and the first signal of the second pair to generate a first signal of a pair of complementary output signals. The second circuit is configured to receive a second signal of the first pair of complementary signals and a second signal of the second pair of complementary signals, and combine the second signal of the first pair and the second signal of second pair to generate a second signal of the pair of complementary output signals.

In some embodiments, the circuit further includes an inverter configured to output one of the complementary signals of the first pair and a pass gate configured to output one of the complementary signals of the second pair. Outputs of the inverter and the pass gate are uncoupled from each other.

In some embodiments, the first circuit includes a coupled inverter circuit configured to combine inverted versions of the first signal of the first pair and the first signal of the second pair to generate the first signal of the pair of complementary output signals.

In some embodiments, the second circuit includes a coupled inverter circuit configured to combine inverted versions of the second signal of the first pair and the second signal of the second pair to generate the second signal of the pair of complementary output signals.

In some embodiments, the circuit further includes a pair of cross-coupled inverters configured to receive the pair of complementary output signals, and generate a pair of cross-coupled signals based on the pair of complementary output signals and cross-coupling of the pair of cross-coupled inverters.

In some embodiments, transistors of the first circuit and the second circuit are sized according to relative transition timing of the first pair of complementary signals and the second pair of complementary signals.

In some embodiments, the first signal of the first pair and the first signal of the second pair are in phase with each other, and wherein the second signal of the first pair and the second signal of the second pair are in phase with each other.

In another embodiment, a circuit includes a first stage circuit and a second stage circuit. The first stage circuit is configured to receive an input signal, and in response to the input signal, generate a first set of signals and a second set of signals at a plurality of output nodes, where the plurality of output nodes are uncoupled from each other. The second stage circuit is configured to receive the first set of signals and the second set of signals at a plurality of input nodes coupled to the plurality of output nodes of the first stage circuit, and intermix the first set of signals and the second set of signals to generate a pair of complementary output signals.

In some embodiments, the first stage circuit includes a chain of inverters configured to generate the first set of signals, and a pass gate and an inverter configured to generate the second pair of signals.

In some embodiments, the second stage circuit includes a pair of coupled inverters, each of the coupled inverters configured to receive a signal from the first set and a signal from the second set in order to intermix the first set of signals and the second set of signals.

In some embodiments, transistors of the pair of coupled inverters are sized according to relative transition timing of the first set of signals and the second set of signals.

Other embodiments are possible, and each of the embodiments can be used alone or together in combination. Accordingly, various embodiments will now be described with reference to the attached drawings.

Embodiments

Figure 1:
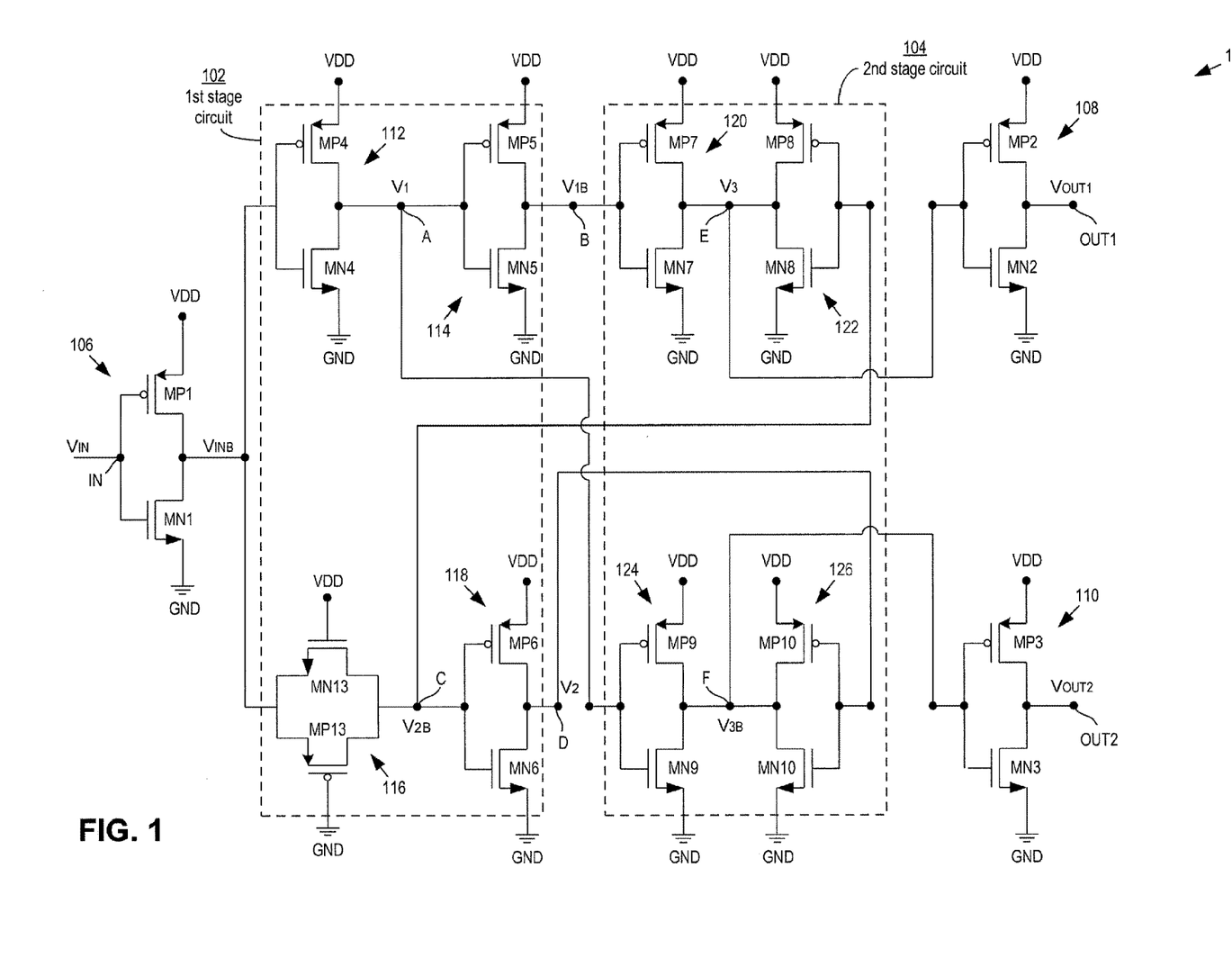
FIG. 1 is a circuit schematic diagram of an example circuit system configured to generate a pair of output signals.
Figure 2:
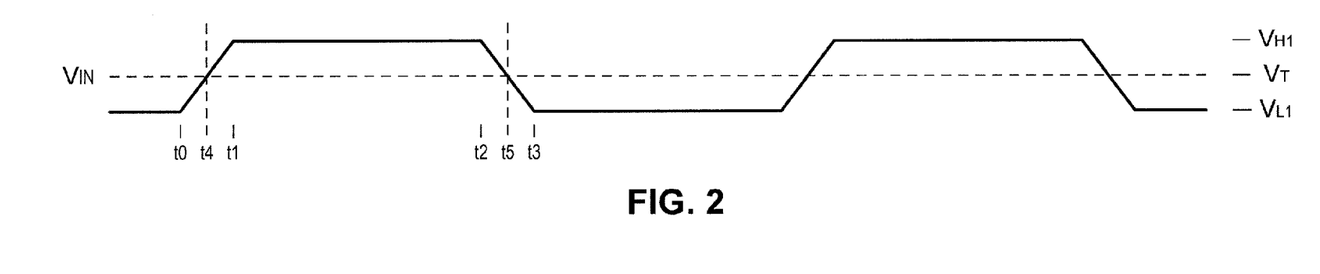
FIG. 2 is a timing diagram of an example waveform of an input signal to the example circuit system of FIG. 1.
Figure 3:
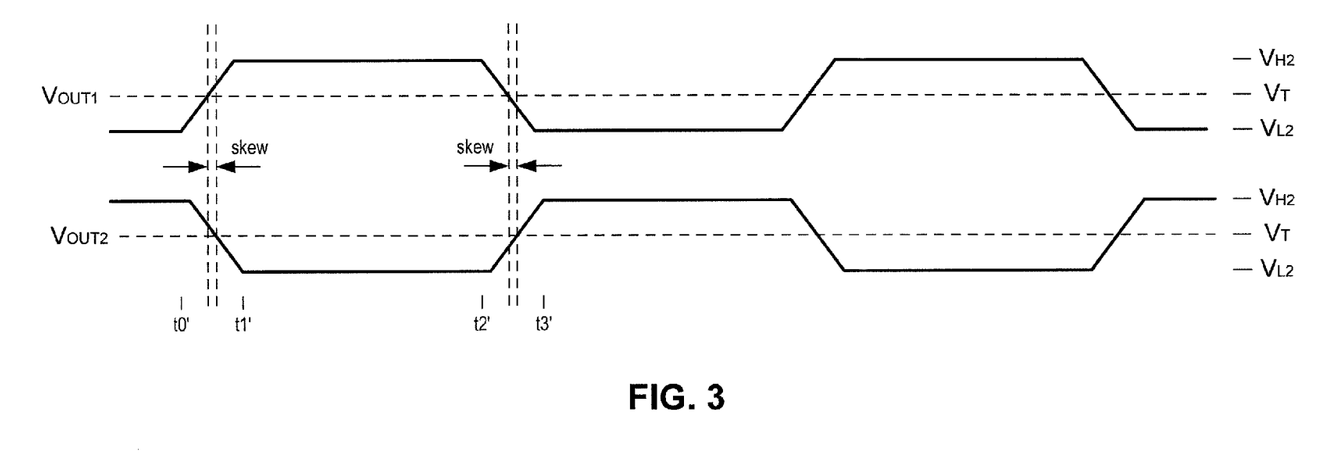
FIG. 3 is a timing diagram of example waveforms of the pair of output signals generated and output by the example circuit system of FIG. 1.

FIG. 1 shows a circuit schematic diagram of an example circuit or circuit system 100 that is configured to receive an input signal $V_{IN}$ at an input node IN and generate a pair of output signals, including a first signal $V_{OUT1}$ at an output node OUT1 and a second signal $V_{OUT2}$ at an output node OUT2, in response to the input signal $V_{IN}$. FIG. 2 shows a timing diagram of an example waveform of the input signal $V_{IN}$ that may be input to and/or received by the example circuit 100. FIG. 3 shows a timing diagram of example waveforms of the pair of output signals $V_{OUT1}$, $V_{OUT2}$ that may be generated and output by the example circuit 100.

Referring to FIGS. 2 and 3, the input signal IN may have a voltage (e.g., a voltage waveform or a voltage as a function of time) that transitions between an associated high voltage level $V_{H1}$ and an associated low voltage level $V_{L1}$. Similarly, the output signals $V_{OUT1}$, $V_{OUT2}$ may have voltages (e.g., voltage waveforms or voltages as a function of time) that each transition between an associated high voltage level $V_{H2}$ and an associated low voltage level $V_{L2}$. In addition, as described in further detail below, the circuit components of the circuit 100 may be configured to generate intermediate signals in between the input node IN and the output nodes OUT1, OUT2 that each transition between associated high voltage levels and associated low voltage levels. As used herein, an associated high voltage level and an associated low voltage level may each be: predetermined voltage levels; a single voltage level; a set or a range of voltage levels such that when a signal makes its transition, it reaches one of the voltage levels in the set or range; a maximum high voltage level or a minimum low voltage level of a respective range; an average level of a respective range; or a combination thereof. In addition or alternatively, an associated high voltage level may be a voltage level that is higher than an associated threshold level and an associated low voltage level may be a voltage level that is lower than the associated threshold level. In addition or alternatively, there may be two associated voltage levels, including an associated high threshold level and an associated low threshold level, such that the associated high voltage level is greater than or equal to the associated high threshold level, and the associated low voltage level is less than or equal to the associated low threshold level.

In addition, each transition that the input signal $V_{IN}$, the output signals $V_{OUT1}$, $V_{OUT2}$, and the intermediate signals make may be a rising transition or a falling transition. A rising transition may be a transition that starts at an associated low voltage level and ends at an associated high voltage level. A falling transition may be a transition that starts at an associated high voltage level and ends and an associated low voltage level.

Also, each transition that the input signal $V_{IN}$, the output signals $V_{OUT1}$, $V_{OUT2}$, and the intermediate signals make may occur during an associated time period. For example, FIG. 2 shows the input signal $V_{IN}$ performing a rising transition during a time period extending from a time $t_0$ to a time $t_1$, and performing a falling transition during a time period extending from a time $t_2$ to a time $t_3$. Similar rising and falling transitions over respective time periods are shown for the output signals $V_{OUT1}$, $V_{OUT2}$ in FIG. 3.

In addition, for a given transition, there may be a start time when the transition begins, an end time when the transition ends, and a point in time in between the start time and the end time when the voltage reaches a transition voltage level $V_T$. For example, during a rising transition of a given signal, there may be a point in time when the voltage of the signal, which had started rising from an associated low voltage level, has reached the transition voltage level $V_T$. An example of this situation is illustrated in FIG. 2, where, during the rising transition extending from $t_0$ to time $t_1$, the voltage of the input signal $V_{IN}$ reaches the transition voltage level $V_T$ at a time $t_4$. Similarly, during a falling transition for a given signal, there may be a point in time when the voltage of the signal, which had started falling from the high voltage level $V_H$, has reached the transition voltage level $V_T$. An example of this situation is illustrated in FIG. 2, where, during the falling transition extending from time $t_2$ to time $t_3$, the voltage of the input signal $V_{IN}$ reaches the transition voltage $V_T$ at a time $t_5$. In some example configurations, the transition voltage level $V_T$ may be a midway or halfway level between an associated high voltage level $V_H$ and an associated low voltage level $V_L$. In addition or alternatively, the transition voltage level $V_T$ may be a threshold voltage level that causes a transistor receiving the signal to change operation states—i.e., to change from being turned on to turned off, or from being turned off to turned on. As used herein, a transition may be referred to as occurring or as having occurred at the time the voltage reaches the transition voltage level $V_T$. Otherwise stated, a given signal may make or perform a transition at the time that the voltage of the signal reaches the transition voltage level $V_T$. For two transitions, the transition that reaches the transition voltage level $V_T$ first or earlier in time may be referred to as the earlier transition, and the transition that reaches the transition voltage level $V_T$ second or later in time may be referred to as the later transition.

Referring particularly to FIG. 3, for some example configurations, the output signals $V_{OUT1}$ and $V_{OUT2}$ may be complementary signals in that when one of the output signals $V_{OUT1}$, $V_{OUT2}$ is at the high voltage level $V_{H2}$ the other is at the low voltage level $V_{L2}$. Otherwise stated, the voltage waveforms of the two output signals $V_{OUT1}$, $V_{OUT2}$ may inversely track each other. One way that the two output signals $V_{OUT1}$, $V_{OUT2}$ may be complementary signals is that they may be phase-shifted 180-degrees relative to each other. In other example configurations, the two output signals $V_{OUT1}$, $V_{OUT2}$ may match or directly track each other. That is, the output signals $V_{OUT1}$, $V_{OUT2}$ may be at the high voltage level $V_{H2}$ at the same time and may be at the low voltage level $V_{L2}$ at the same time. One way that the two output signals $V_{OUT1}$, $V_{OUT2}$ may directly match each other is that they may be in-phase with each other.

By being two signals that directly or inversely track each other (or that are in-phase or 180-degrees out of phase with each other), the output signals $V_{OUT1}$, $V_{OUT2}$ may generally perform their respective transitions at around the same time. Ideally, the output signals $V_{OUT1}$, $V_{OUT2}$ perform their respective transitions at exactly the same time. However, in actual implementation, for two given transitions respectively performed by the two output signals $V_{OUT1}$, $V_{OUT2}$, that occur closest in time, there may be some difference in time that the two output signals $V_{OUT1}$, $V_{OUT2}$ perform their respective transitions. This difference in time may be referred to as skew.

FIG. 3 shows an example illustration of skew between the two output signals $V_{OUT1}$, $V_{OUT2}$. In particular, FIG. 3 shows the first output signal $V_{OUT1}$ performing a rising transition and the second output signal $V_{OUT2}$ performing a falling transition during a time period extending from a time to, to a time tr. During that time period, the first output signal $V_{OUT1}$ may perform its rising transition before the second output signal $V_{OUT2}$ performs its falling transition, resulting in skew between the two output signals $V_{OUT1}$, $V_{OUT2}$ during the time period between time $t_0$, to time $t_1$. Similarly, FIG. 3 shows the first output signal $V_{OUT1}$ performing a falling transition and the second output signal $V_{OUT2}$ performing a rising transition during a time period extending from a time $t_2$, to a time $t_3$. During that time period, the first output signal $V_{OUT1}$ performs its falling transition before the second output signal $V_{OUT2}$ performs its rising transition, resulting in skew between the two output signals $V_{OUT1}$, $V_{OUT2}$ during the time period between time $t_2$, to time $t_3$. As described in further detail below, the circuit configurations of the example circuit 100 of FIG. 1 (and the example circuit 500 of FIG. 5) are configured to minimize the skew between the two output signals $V_{OUT1}$, $V_{OUT2}$.

Referring back to FIG. 1, the example circuit 100 may include a first stage circuit 102 and a second stage circuit 104. The first stage circuit 102 may be configured to generate two pairs of signals, including a first pair of signals $V_1$, $V_{1B}$ and a second pair of signals $V_2$, $V_{2B}$. The first stage circuit 102 may provide the first pair of signals $V_1$, $V_{1B}$ and the second pair of signals $V_2$, $V_{2B}$ to the second stage circuit 104. In response to receipt of the first pair of signals $V_1$, $V_{1B}$ and the second pair of signals $V_2$, $V_{2B}$, the second stage circuit 104 may be configured to generate a third pair of signals $V_3$, $V_{3B}$.

For some example configurations, as shown in FIG. 1, the first stage circuit 102 may be configured to generate the first pair of signals and the second pair of signals in response to an inverted input signal $V_{INB}$, which may be an inverted version of the input signal $V_{IN}$. As shown in FIG. 1, the circuit 100 may include an input stage circuit, which for some example configurations, may include a first inverter or inverter circuit 106 that is configured to receive the input signal $V_{IN}$ and invert the input signal $V_{IN}$ to generate the inverted input signal $V_{INB}$. For other example configurations, the first inverter 106 may be excluded or omitted from the example circuit 100 and the input signal $V_{IN}$ may be input directly to the first stage circuit 102. For still other example configurations, an input stage circuit may be included, but may have a different configuration from a single inverter. For example, the input stage circuit may include more than one inverter such that the input signal $V_{IN}$ is inverted more than once before being provided to the first stage circuit 102. In addition or alternatively, the input stage circuit may include an even-number of inverters such that the signal that is input to the first stage circuit 102 is a delayed version, but not an inverted version, of the input signal $V_{IN}$. For other example configurations, circuits other than inverters may be used instead of or in combination with one or more inverters for the configuration of the input stage circuit. Various configurations of the input stage circuit may be possible.

Also, FIG. 1 shows the circuit 100 as generally including a plurality of inverters or inverter circuits, one of which may be the first inverter 106. Each ith inverter is shown as including an ith p-channel metal-oxide-semiconductor field effect transistor (PMOS transistor) MPi and an ith n-channel metal-oxide-semiconductor field effect transistor (NMOS transistor) MNi. For example, the first inverter 106 is shown as including a first PMOS transistor MP1 and a first NMOS transistor MN1. For each ith inverter, the ith PMOS transistor MPi and the ith NMOS transistor MNi may have their gate terminals coupled or tied together and are configured to receive an input signal of the ith inverter. In addition, the ith PMOS transistor MPi may have its source terminal coupled to a source or supply voltage VDD of the example circuit 100, and the ith NMOS transistor MNi may have its source terminal coupled to a ground reference voltage (GND). The plurality of inverters may be configured to generate the intermediate signals and the output signals $V_{OUT1}$, $V_{OUT2}$ at associated high and low voltage levels corresponding to the supply voltage level VDD and the ground reference voltage level GND. Also, for an ith inverter, the drain terminals of the ith PMOS transistor MPi and the ith NMOS transistor MNi may be coupled or tied together. The ith inverter may be configured to generate its output signal, which is an inverted version of its input signal, at the drain terminals of the ith PMOS transistor MPi and the ith NMOS transistor MNi.

In operation, when the input signal of the ith inverter is at a high voltage level or at or above a threshold voltage level $V_{TH}$ of the ith PMOS and NMOS transistors MPi, MNi, the ith PMOS transistor MPi may be turned off and the ith NMOS transistor MNi may be turned on, causing the ith inverter to generate its output signal at a low voltage level corresponding to the ground reference voltage level GND). Alternatively, when the input signal of the ith inverter is at a low voltage level or at a voltage level below the threshold voltage level $V_{TH}$, the ith PMOS transistor MPi may be turned on and the ith NMOS transistor MNi may be turned off, causing the ith inverter to generate its output signal at a high voltage level corresponding to the source or supply voltage level VDD.

When the voltage of the input signal to the ith inverter performs a rising transition and the voltage is then is maintained at an associated high voltage level for a period of time before a next transition begins, the ith inverter may respond by transitioning its output voltage from an associated high output voltage level down to an associated low output voltage level, and then may maintain the output voltage at the low voltage level until the ith inverter responds to a next transition of the input signal. Alternatively, when the voltage of the input signal to the ith inverter performs a falling transition and the voltage is then maintained at an associated low voltage level for a period of time before a next transition begins, the ith inverter may respond by transitioning its output voltage from an associated low output voltage level up to an associated high voltage level, and then may maintain the output voltage at the high voltage level until the ith inverter responds to a next transition of the input signal.

For some example configurations, as shown in FIG. 1, the example circuit 100 may include an output stage circuit, which may include a second inverter 108 comprising a second PMOS transistor MP2 and a second NMOS transistor MN2, and a third inverter 110 comprising a third PMOS transistor MP3 and a third NMOS transistor MN3. The second inverter 108 may be configured to receive the first signal of the third pair $V_3$ and invert the first signal $V_3$ to generate the first output signal $V_{OUT1}$. The third inverter 110 may be configured to receive the second signal of the third pair $V_{3B}$ and invert the second signal $V_{3B}$ to generate the second output signal $V_{OUT2}$. For other example configurations, the output stage circuit may be excluded or omitted from the example circuit 100, and the output signals $V_{OUT1}$, $V_{OUT2}$ may be the third pair of signals $V_3$, $V_{3B}$. For still other example configurations, an output stage circuit may be included, but may have a different configuration than the second and third inverters 108, 110 to generate the output signals $V_{OUT1}$, $V_{OUT2}$. For example, instead of including only one inverter to receive and invert the first signal of the third pair $V_3$ and only one inverter to receive and invert the second signal of the third pair $V_{3B}$, the output stage circuit may include multiple inverters configured to receive and invert the first signal of the third pair $V_3$ multiple times to generate the first output signal $V_{OUT1}$, and/or may include multiple inverters configured to receive and invert the second signal of the third pair $V_{3B}$ multiple times to generate the second output signal $V_{OUT2}$. In addition or alternatively, the circuit component configured to receive the first signal of the third pair $V_3$ and/or the circuit component configured to receive the second signal of the third pair $V_{3B}$ may include an even-number of inverters such that the signal that the first output signal $V_{OUT1}$ and/or the second output signal $V_{OUT2}$ is a delayed version, but not an inverted version, of the first signal of the third pair $V_3$ and/or the second signal of the third pair $V_{3B}$, respectively. For other example configurations, circuits other than inverters may be used instead of or in combination with one or more inverters for the configuration of the output stage circuit. Various configurations of the output stage circuit may be possible.

In addition, the first stage circuit 102 may include a first inverter chain that includes a fourth inverter 112 and a fifth inverter 114. The fourth inverter 112 may include a fourth PMOS transistor MP4 and a fourth NMOS transistor MN4. The fifth inverter 114 may include a fifth PMOS transistor MP5 and a fifth NMOS transistor MN5. The fourth inverter 112 may be configured to receive the inverted input signal $V_{INB}$ and invert the inverted input signal $V_{INB}$ to generate the first signal of the first pair $V_1$ at a node A. The fifth inverter 114 may have its input coupled to the output of the fourth inverter 112 at node A. In addition, the fifth inverter 114 may be configured to receive the first signal $V_1$ as its input signal and invert the first signal of the first pair $V_1$ to generate the second signal of first pair $V_{1B}$ at a node B.

In addition, the first stage circuit 102 may include a pass gate circuit 116 that includes an NMOS transistor MN13 and a PMOS transistor MP13. As shown in FIG. 1, the NMOS transistor MN13 and the PMOS transistor MP13 may have their respective source terminals coupled or tied together to form an input of the pass gate 116, and may have their respective drain terminals coupled together to form an output of the pass gate. In addition, the NMOS transistor MN13 of the pass gate 116 may have its gate terminal configured to receive the supply voltage VDD and the gate terminal of the PMOS transistor MP13 may be coupled to the ground reference voltage GND. With the gate terminal of the NMOS transistor MN13 configured to receive the supply voltage VDD and the gate terminal of the PMOS transistor MP13 coupled to the ground reference voltage GND, the pass gate circuit 116 may be configured to pass the inverted input signal $V_{INB}$ to its output to generate the second signal of the second pair $V_{2B}$ at a node C. That is, the pass gate circuit 116 may be configured to generate the second signal of the second pair $V_{2B}$ at node C by setting the voltage at node C to the voltage of the inverted input signal $V_{INB}$.

The first stage circuit 102 may further include a sixth inverter 118 comprising a sixth PMOS transistor MP6 and a sixth NMOS transistor MN6. The input of the sixth inverter 118 may be coupled to the output of the pass gate circuit 116 at node C and configured to receive the first signal of the second pair $V_{2B}$. The sixth inverter 118 may be configured to invert the first signal of the second pair $V_{2B}$ to generate the second signal of the second pair $V_2$ at a node D.

Figure 4:
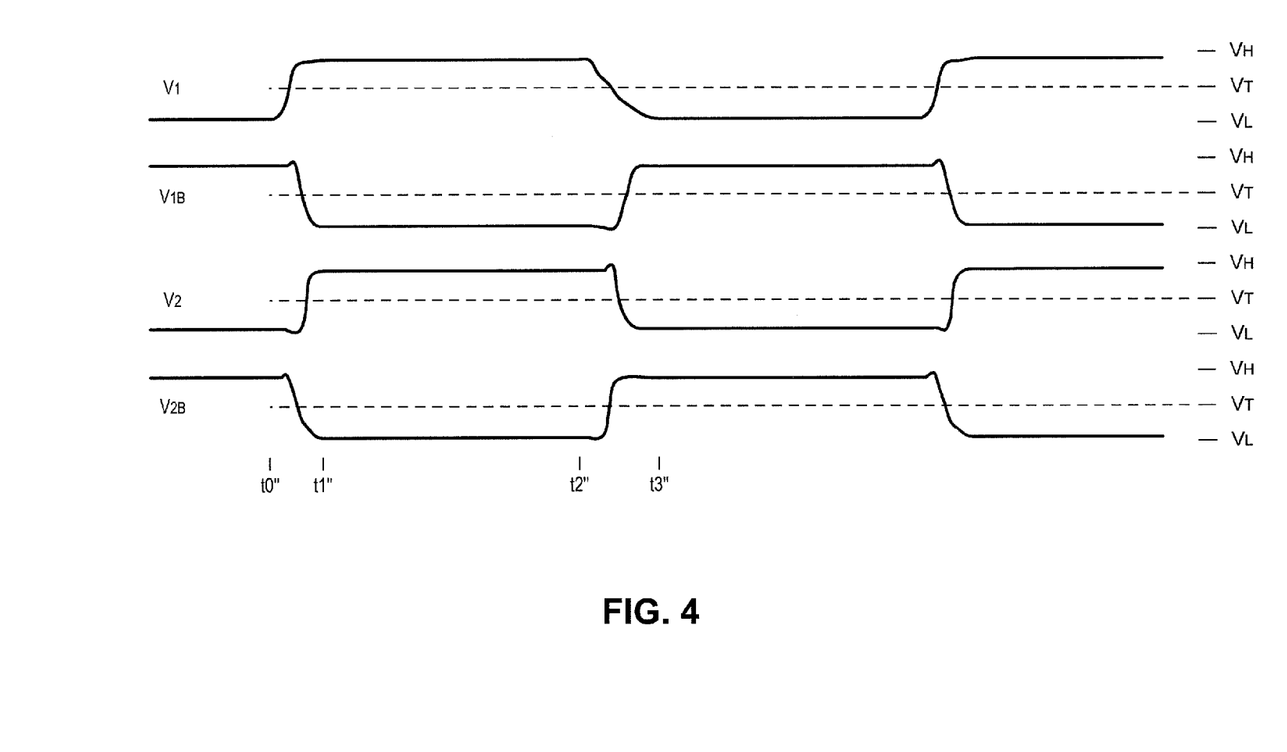
FIG. 4 is a timing diagram of example waveforms of a first pair and a second pair of signals generated by a first stage circuit of the example circuit system of FIG. 1.

FIG. 4 shows a timing diagram of example voltage waveforms of the first pair of signals $V_1$, $V_{1B}$ and the second pair of signals $V_2$, $V_{2B}$. As shown in FIG. 4, the first pair of signals $V_1$, $V_{1B}$ and the second pair of signals $V_2$, $V_{2B}$ are each generated to transition between a voltage level corresponding to a high voltage level $V_H$ and a voltage level corresponding to a low voltage level $V_L$. With respect to FIG. 1, the high voltage level $V_H$ may be the supply voltage level VDD and the low voltage level $V_L$ may be the ground reference voltage level GND. In addition, the first pair of signals $V_1$, $V_{1B}$ generated by the fourth and fifth inverters 112, 114 may be complementary signals with some skew between them due to the fourth inverter 112 generating the first signal of the first pair $V_1$ first, and then the fifth inverter 114 generating the second signal of the first pair $V_{1B}$ in response to first signal of the first pair $V_1$. That is, for two respective transitions of the first and second signals $V_1$, $V_{1B}$ occurring closest in time, the transition of the first signal $V_1$ may be performed (i.e., may reach the transition voltage level $V_T$) earlier than the transition of second signal $V_{1B}$. This is shown in FIG. 4. During the time period extending from a time $t_{0'''}$ to a time $t_{1'''}$, the first signal $V_1$ may perform its rising transition earlier than the second signal $V_{1B}$ may perform its falling transition. In addition, during the time period extending from a time $t_{2'''}$ to a time $t_{3'''}$, the first signal $V_1$ may perform its falling transition earlier than the second signal $V_{1B}$ may perform its rising transition.

In a similar manner, the second pair of signals $V_2$, $V_{2B}$ generated by the pass gate circuit 116 and the sixth inverter 118 may be complementary signals with some skew between them due to the pass gate circuit 116 generating the first signal of the second pair $V_{2B}$ first, and then the sixth inverter 118 generating the second signal of the second pair $V_2$ in response to the first signal of the second pair $V_{2B}$. With reference to FIG. 4, during the time period extending from time $t_{0'''}$ to time $t_{1'''}$, the first signal $V_{2B}$ may perform its falling transition earlier than the second signal $V_2$ performs its rising transition. In addition, during the time period extending from time $t_{2'''}$ to time $t_{3'''}$, the first signal $V_{2B}$ may perform its rising transition earlier than the second signal $V_2$ performs its falling transition.

In general, for two signals that each perform a respective transition during each of a plurality of time periods, the signal that performs its transitions earlier than the other signal, at least on average or the majority of the time, may be referred to as the early-transitioning signal or earlier-transitioning signal of the two signals, and the signal that performs its transitions later than the other signal, at least on average or the majority of the time, may be referred to as late-transitioning signal or later-transitioning signal of the two signals. So, for example with respect to FIG. 4, the first signal of the first pair $V_1$ may be referred to as the early-transitioning or earlier-transitioning signal of the first pair of signals, and the second signal of the first pair $V_{1B}$ may be referred to as the late-transitioning or later-transitioning signal of the first pair of signals. In addition, the first signal of the second pair $V_{2B}$ may be referred to as the early-transitioning or earlier-transitioning signal of the second pair of signals, and the second signal of the second pair $V_2$ may be referred to as the late-transitioning or later-transitioning signal of the second pair of signals.

Referring back to FIG. 1, the second stage circuit 104, in order to generate the third pair of signals $V_3$, $V_{3B}$, may be configured to combine one of the first pair of signals $V_1$, $V_{1B}$ with one of the second pair $V_2$, $V_{2B}$, and may further be configured to combine the other of the first pair of signals $V_1$, $V_{1B}$ with the other of the second pair of signals $V_2$, $V_{2B}$. Which of the signals of the first pair $V_1$, $V_{1B}$ and which of the signals of the second pair $V_2$, $V_{2B}$ are combined together to generate the third pair of signals $V_3$, $V_{3B}$ may depend and/or be based on their relative transition timing. In a particular example configuration as shown in FIG. 1, the late-transitioning signal of the first pair $V_{1B}$ may be combined with the early-transitioning signal of the second pair $V_{2B}$ to generate the first signal of the third pair $V_3$, and the early-transitioning signal of the first pair $V_1$ may be combined with the late transitioning signal of the second pair $V_2$ to generate the second signal of the third pair $V_{3B}$. Otherwise stated, for the two pairs of signals $V_1$, $V_{1B}$, $V_2$, $V_{2B}$, the early-transitioning signal of one pair may be combined with the late-transitioning signal of the other pair in order to generate the third pair of signals $V_3$, $V_{3B}$.

In addition or alternatively, which of the signals of the first pair $V_1$, $V_{1B}$ and which of the signals of the second pair $V_2$, $V_{2B}$ are combined together may depend on which signals are in-phase with each other, or at least which signals are closer in-phase with each other. Accordingly, with reference to FIG. 4, as shown in FIG. 4, the second, late-transitioning signal of the second pair $V_2$ is in-phase or closer to being in phase with the first, early-transitioning signal of the first pair $V_1$, compared to the first, early-transitioning signal of the second pair $V_{2B}$. Similarly, the first, early-transitioning signal of the second pair $V_{2B}$ is in-phase or closer to being in-phase with the second, late-transitioning signal of the first pair, compared to the second, late-transitioning signal $V_2$.

The second stage circuit 104 may include a pair of coupled inverter circuits to combine the two pairs of signals $V_1$, $V_{1B}$, $V_2$, $V_{2B}$ to generate the third pair of signals $V_3$, $V_{3B}$. Each of the coupled inverter circuits may include two inverters, each configured to receive and invert one of the signals $V_1$, $V_{1B}$, $V_2$, $V_{2B}$. The outputs of the two inverters may be coupled or tied together, and the output of the coupled inverter circuit may be the combined output or the combination of the two outputs of the inverters.

In further detail, a first coupled inverter circuit of the second stage circuit 104 may include a seventh inverter 120 comprising a seventh PMOS transistor MP7 and a seventh NMOS transistor MN7 and an eighth inverter 122 comprising an eighth PMOS transistor MP8 and an eighth NMOS transistor MN8. As shown in FIG. 1, the input of the seventh inverter 120 may be coupled to node B and configured to receive the second, late-transitioning signal of the first pair $V_{1B}$. The seventh inverter 120 may be configured to invert the second, late-transitioning signal of the first pair $V_{1B}$ to generate its respective output signal. In addition, the input of the eighth inverter 122 may be coupled to node C and configured to receive the first, early-transitioning signal of the second pair $V_{2B}$. The eighth inverter 122 may be configured to invert the first, early-transitioning signal of the second pair $V_{2B}$ to generate its respective output signal. The outputs of seventh inverter 120 and the eighth inverter 122 may be coupled together at a node E, where the output voltages of the seventh inverter 120 and the eighth inverter 122 may be combined to generate the first signal of the third pair $V_3$.

In addition, a second coupled inverter circuit of the second stage circuit 104 may include a ninth inverter 124 comprising a ninth PMOS transistor MP9 and a ninth NMOS transistor MN9 and a tenth inverter 126 comprising a tenth PMOS transistor MP10 and a tenth NMOS transistor MN10. As shown in FIG. 1, the input of the ninth inverter 124 may be coupled to node A and configured to receive the first, early-transitioning signal of the first pair $V_1$. The ninth inverter 124 may be configured to invert the first, early-transitioning signal of the first pair $V_1$ to generate its respective output signal. In addition, the input of the tenth inverter 126 may be coupled to node D and configured to receive the second, late-transitioning signal of the second pair $V_2$. The tenth inverter 126 may be configured to invert the second, late-transitioning signal of the second pair $V_2$ to generate its respective output signal. The outputs of ninth inverter 124 and the tenth inverter 126 may be coupled together at a node F, where the output voltages of the ninth inverter 124 and the tenth inverter 126 may be combined to generate the second signal of the third pair $V_{3B}$.

The voltage levels of the each of the first and second signals of the third pair $V_3$, $V_{3B}$ may be determined based on the relative timings of the transitions of the signals of the first and second pairs $V_1$, $V_{1B}$, $V_2$, $V_{2B}$. For example, with reference to the first coupled inverter circuit, suppose as an example that the first signal of the second pair $V_{2B}$ transitions earlier than the second signal of the first pair $V_{1B}$. During a time period that the two signals $V_{1B}$, $V_{2B}$ perform respective falling transitions, the eighth inverter 122 may start to pull up the voltage at node E toward the supply voltage level VDD while the seventh inverter 120 may still operate to keep the voltage at node E at a low voltage level at or near ground GND due to the voltage of the first signal of the second pair $V_{2B}$ reaching or falling below the transition voltage level $V_T$ before the voltage of the second signal of the first pair $V_{1B}$. Subsequently, when the falling transition of the second signal of the first pair $V_{1B}$ reaches or falls below the transition voltage level $V_T$, the seventh inverter 120 may respond by participating with eighth inverter 122 in pulling up the voltage at node E toward the supply voltage level VDD. The ninth and tenth inverters 124, 126 of the second coupled inverter may operate in a similar manner.

The sizes and/or strength of the transistors of the seventh, eighth, ninth, and tenth inverters 120, 122, 124, 126 may influence or affect the transition rates or speeds of the transitions of the third pair of signals $V_3$, $V_{3B}$. In general, increasing the gate width of a transistor may correspondingly increase the amount of drain-to-source current the transistor may draw for a given bias condition, and may also increase the amount of load capacitance provided by the transistor. Increasing the amount of current the transistor may draw may increase the speed at which the transistor may operate to pull up an output voltage to an associated high voltage level or push down the output voltage to an associated low voltage level. Conversely, increasing the load capacitance may decrease the speed at which the transistor may operate to pull up or push down the output voltage. Depending on the size of the gate width and/or how much a gate width is being changed, increasing or decreasing the gate width a certain amount can both have the effects of increasing or decreasing the speed at which a transistor pulls up or pushes down an output voltage, depending on whether the respective increase or decrease in the current draw capability of the transistor resulting from the change in gate width outweighs the resulting increase or decrease in capacitance, or vice versa. Transistors with the ability to pull up or push down voltages at faster rates may be considered or characterized as stronger, and transistors that pull up or push down voltages at slower rates may be considered or characterized as weaker.

The transistors of the seventh to tenth inverters 120-126 may be sized to be stronger and weaker (or of equal strength) relative to each other in order to influence or affect when the transitions of the third pair of signals $V_3$, $V_{3B}$ occur. In particular, the transistors may be sized to yield transition timings that provide for minimum skew between the first signal and the second signal of the third pair $V_3$, $V_{3B}$. To illustrate, using the example above, suppose it is desirable for the voltage at node E to be pulled up from ground GND faster so that the rising transitions of the first signal of the third pair $V_3$ occur closer in time with the falling transitions of the second signal of the third pair $V_{3B}$. Accordingly, the eighth PMOS transistor MP8 may be sized to be stronger than the seventh NMOS transistor MN7 so that when the falling transition of the first signal of the second pair $V_{2B}$ occurs first, the pulling up performed by the eighth PMOS transistor MP8 will have a stronger influence on the voltage level of the voltage at node E than the pushing down performed by the seventh NMOS transistor MN7 so that the first signal of the third pair $V_3$ performs its rising transitions faster. Alternatively, in the event it is desirable for the rising transitions of the first signal of the third pair $V_3$ to be made slower, the seventh NMOS transistor MN7 may be stronger than the eighth PMOS transistor. Similarly, the sizes and/or strengths of the seventh PMOS transistor MP7 and the eighth NMOS transistor may be set relative to each other to affect or influence the falling transitions of the first signal of the third pair $V_3$. Likewise, the sizes and/or strengths of the ninth PMOS and NMOS transistors MP9, MN9 and the tenth PMOS and NMOS transistors MP10, MN10 of the second coupled inverter may be set to affect or influence when the rising and falling transitions of the second signal of the third pair $V_{3B}$ occur. In sum, the sizes and/or strengths of the seventh, eighth, ninth, and tenth NMOS and PMOS transistors MP7, MN7, MP8, MN8, MP9, MN9, MP10, and MN10 making up the first and second coupled inverters may be set in accordance with and/or in proportion to the relative transition timings of the rising and falling transitions of the first and second pairs of signals $V_1$, $V_{1B}$, $V_2$, $V_{2B}$ in order to affect or influence the times that the rising and falling transitions of the first and second signals of the third pair $V_3$, $V_{3B}$, and in such a way as to minimize skew between the first and second signals of the third pair $V_3$, $V_{3B}$.

As shown in FIG. 1, there may be a one-to-one correspondence between the four inputs of the two coupled inverters and the four nodes A, B, C, and D at which the first and second pairs of signals $V_1$, $V_{1B}$, $V_2$, $V_{2B}$ are generated. Otherwise stated, the four input nodes of the two coupled inverters may be uncoupled with each other. From a design perspective, the uncoupling of the four input nodes may provide for independent control of setting the sizes and/or strengths of the seventh and eighth NMOS and PMOS transistors MP7, MN7, MP8, MN8 of the first coupled inverter, and the sizes and/or strengths of the ninth and tenth PMOS and NMOS transistors MP9, MN9, MP10, MP10 of the second coupled inverter.

The independent control of setting the strengths and/or sizes of the transistors may, in turn, allow for reduced skew and/or for a designer of the example circuit 100 to have enhanced or tighter control in designing the example circuit 100 to have minimized skew between the first and second output signals $V_{OUT1}$, $V_{OUT2}$, especially across varying process, voltage, temperature (PVT) conditions, compared to other circuits that aim to minimize skew between two signals. In addition, a designer may have enhanced or tighter control with respect to the delay of the output signals $V_{OUT1}$, $V_{OUT2}$, which in turn may allow the duty cycles between the output signals $V_{OUT1}$, $V_{OUT2}$ to be more closely matched and duty cycle variation or distortion between the output signals $V_{OUT1}$, $V_{OUT2}$ to be reduced or minimized.

Another feature of the example circuit 100 is that nodes A, B, C, and D where the first and second pairs $V_1$, $V_{1B}$, $V_2$, $V_{2B}$ are generated may be uncoupled together, which may have the benefit of reducing current consumption (static and/or dynamic) by not having a current path extending through the fifth and sixth inverters 114, 118. In contrast, other example circuits that aim to minimize skew may not include the second stage circuit 104 and/or may cross-couple the nodes A, B, C, and D where the first and second pairs of signals $V_1$, $V_{1B}$, $V_2$, $V_{2B}$ are generated. In particular, node A may be coupled to node D, and node B may be coupled to node C. In other words, the output of the fifth inverter 114 is coupled to the input of the sixth inverter 118, and the output of the sixth inverter 118 is coupled to the input of the fifth inverter 114. Such a cross-coupling configuration, however, may create a current path in the transistors of the fifth and sixth inverters 114, 118, which may cause current consumption. However, for the example circuit 100, by configuring the nodes A, B, C, and D to be uncoupled with each other and/or the fifth and sixth inverters 114, 118 to not be cross-coupled, a current path through the fifth and sixth inverters 114, 118 may be avoided, which in turn may serve to reduce overall current and/or power consumed during operation of the example circuit 100.

In addition, for de-skewer circuits that couple nodes A, B, C, and D and/or cross-couple the fifth and sixth inverters 114, 118, the feedback resulting from the cross-coupling may cause the sizes of the first PMOS and NMOS transistors MP1, MN1 of the input stage circuit to be increased in order to increase the operating frequency of the example circuit 100 (i.e., the frequency at which the signals generated by the circuit components of the example circuit 100 transition between respective high and low voltage levels). Increasing the sizes of the first PMOS and NMOS transistors MP1, MN1 may have the undesirable effect of increased duty cycle distortion between the pair of output signals. In contrast, for the example circuit 100 of FIG. 1, by uncoupling the nodes A, B, C, and D and not cross-coupling the fifth and sixth inverters 114, 118, the operating frequency of the example circuit 100 may be increased without having to increase the sizes of the first PMOS and NMOS transistors MP1, MN1. As such, the undesirable effect of increased duty cycle distortion due to increasing the sizes of the first PMOS and NMOS transistors MP1, MN1 may be avoided while still increasing the operating frequency of the example circuit 100. Also, by not having to increase the sizes of the first PMOS and NMOS transistors MP1, MN1, current consumption with respect to the current drawn by the first PMOS and NMOS transistors MP1, MN1 may not be increased.

Figure 5:
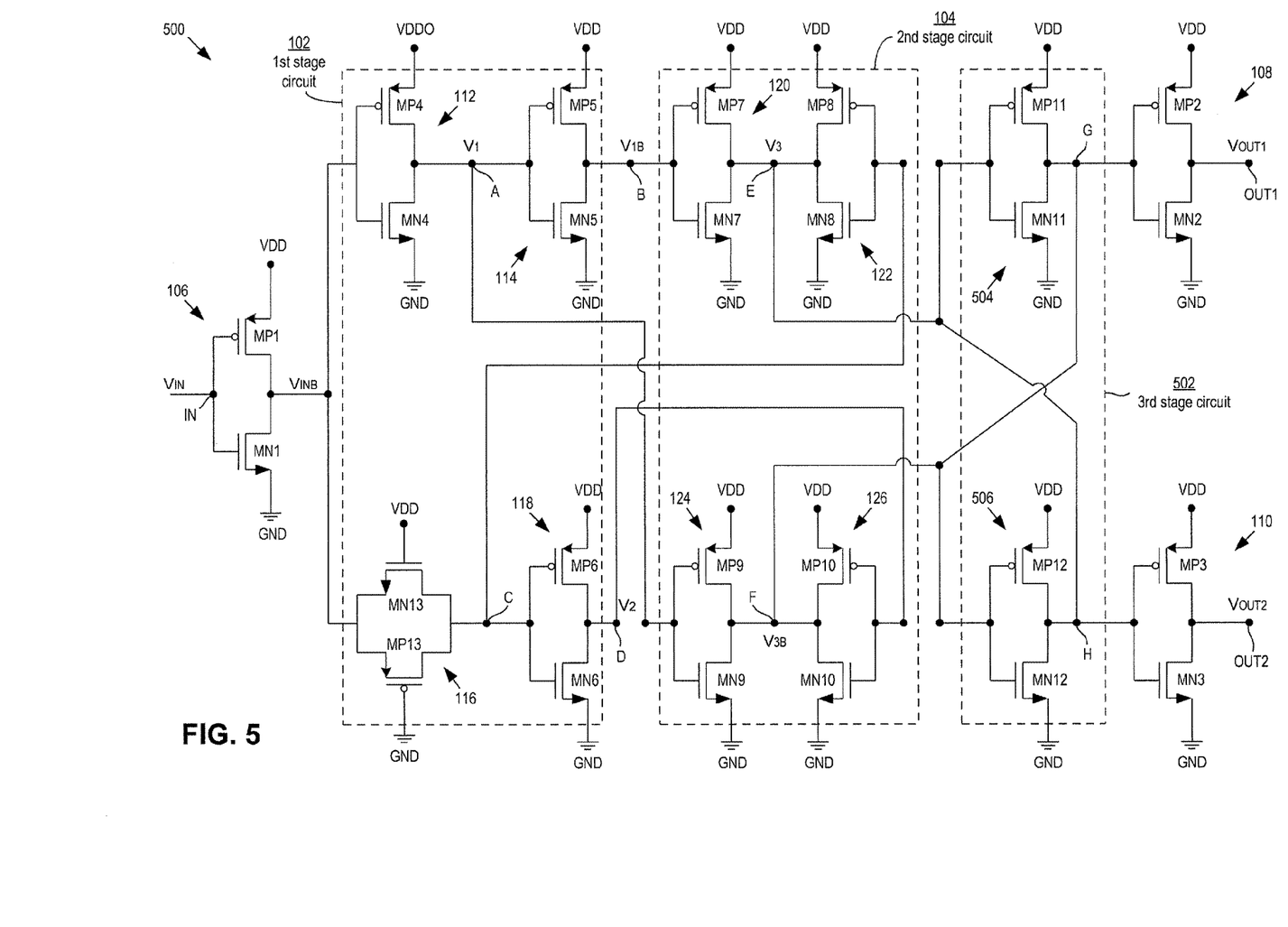
FIG. 5 is circuit schematic diagram of another example circuit system configured to generate a pair of output signals.

FIG. 5 shows a circuit schematic of another example circuit or circuit system 500. The example circuit 500 of FIG. 5 may be similar to the example circuit 100 of FIG. 1 in that it may include a first stage circuit, a second stage circuit, an input stage circuit, and an output stage circuit. Like the example circuit 100, the example circuit 500 may be configured to receive an input signal $V_{IN}$ at an input node IN and generate and output a pair of output signals $V_{OUT1}$, $V_{OUT2}$ at a pair of output nodes OUT1, OUT2 in response to the input signal $V_{IN}$. Also, like the example circuit 100, the circuit components of the example circuit 500 may be sized to reduce and/or minimize skew between the output signals $V_{OUT1}$, $V_{OUT2}$. Circuit components of the example circuit 500 that are the same or similar to those in the example circuit 100 are labeled with the same reference numbers.

A difference between the example circuit 100 of FIG. 1 and the example circuit 500 of FIG. 5 is that the example circuit 500 may further include a third stage circuit 502 configured in between the second stage circuit 104 and the second and third inverters 108, 110 of the output stage circuit. The third stage circuit 502 may include a pair of cross-coupled inverters, including an eleventh inverter 504 comprising an eleventh PMOS transistor MP11 and an eleventh NMOS transistor MN11 and a twelfth inverter 506 comprising a twelfth PMOS transistor MP12 and a twelfth NMOS transistor MN12. By being cross-coupled, the input of the eleventh inverter 504 may be coupled to the output of the twelfth inverter 506, and the input of the twelfth inverter 506 may be coupled to the output of the eleventh inverter 504.

As shown in FIG. 5, the input of the eleventh inverter 504 may be coupled to the output of the first coupled inverter of the second stage circuit 104 at node E. Accordingly, due to the cross-coupling, the eleventh inverter 504 may be configured to receive at its input a combination of the first signal of the third pair $V_3$ and the output of the twelfth inverter 506 generated at a node H. The eleventh inverter 504 may be configured to invert the combined signal to generate its output signal at a node G. Also, as shown in FIG. 5, the input of the second inverter 108 of the output stage circuit may be coupled to the output of the eleventh inverter 504 at node G and configured to invert the output signal of the eleventh inverter 504 to generate the first output signal $V_{OUT1}$.

In addition, the input of the twelfth inverter 506 may be coupled to the output of the second coupled inverter of the second stage circuit 104 at node F. Accordingly, due to the cross-coupling, the twelfth inverter 506 may be configured to receive at its input a combination of the second signal of the third pair $V_{3B}$ and the output of the eleventh inverter 504 generated at node G. The twelfth inverter 506 may be configured to invert the combined signal to generate its output signal at node H. Also, as shown in FIG. 5, the input of the third inverter 110 of the output stage circuit may be coupled to the output of the twelfth inverter 506 at node H and configured to invert the output signal of the twelfth inverter 506 to generate the second output signal $V_{OUT2}$.

The cross-coupling of the eleventh and twelfth inverters 504, 506 may provide a positive feedback connection with the outputs of the first and second coupled inverters of the second stage circuit 104. The positive feedback connection may initially function to oppose changes in voltage levels generated at nodes E and F by the first and second coupled inverters until a threshold voltage level associated with the cross-coupled inverters 504, 506 is reached. In response to the threshold voltage level being reached, the PMOS and NMOS transistors MP11, MN11, MP12, MN12 of the eleventh and twelfth inverters 504, 506 may switch states to facilitate in the changing of the voltage levels generated at nodes E and F. Such operation may cause the transitions of the third pair of signals $V_3$, $V_{3B}$, and in turn the transitions of the output signals $V_{OUT1}$, $V_{OUT2}$, to be sharper compared to the third pair of signals $V_3$, $V_{3B}$ and the output signals $V_{OUT1}$, $V_{OUT2}$ generated by the example circuit 100 of FIG. 1. The sharper transitions may result in even further reduced skew and/or duty cycle distortion.

Referring to FIGS. 1 and 5, and as previously described, the first stage circuit 102 may generate the first and second signals of the first pair $V_1$, $V_{1B}$ as complementary signals and/or as signals that inversely track each other, and the first and second signals of the second pair $V_2$, $V_{2B}$ as complementary signals and/or as signals that inversely track each other. In other example configurations, the first stage circuit 102 may be differently configured such that the first pair of signals $V_1$, $V_{1B}$ and the second pair of the signals $V_2$, $V_{2B}$ that it generates have matching voltage waveforms and/or directly track each other. Despite having matching voltage waveforms, the first pair of signals $V_1$, $V_{1B}$ and the second pair of signals $V_2$, $V_{2B}$ may each include an early-transitioning signal and a late-transitioning signal. For these other example configurations, the first stage circuit 102 may be connected to the second stage circuit 104 in a similar manner as shown in FIGS. 1 and 5 in that the second stage circuit 104, such as through use of a pair of coupled inverters, may combine the early-transitioning signal of the first pair with the late-transitioning signal of the second pair to generate one of the signals of the third pair $V_3$, $V_{3B}$, and may combine the late-transitioning signal of the first pair with the early-transitioning signal of the second pair to generate the other signal of the third pair $V_3$, $V_{3B}$. Similar to voltage waveforms of the first and second pairs of signals $V_1$, $V_{1B}$, $V_2$, $V_{2B}$, the third pair of signals $V_3$, $V_3B$ may have matching voltage waveforms and/or waveforms that directly track each other, and in turn the output signals $V_{OUT1}$, $V_{OUT2}$ may have matching voltage waveforms and/or waveforms that directly track each other. In sum, the features of the example circuits 100, 500, including those of the second stage circuit 104 and/or the third stage circuit 502, that minimize skew may be implemented in circuits configured to generate a pair of output signals $V_{OUT1}$, $V_{OUT2}$ that have complementary voltage waveforms (or waveforms that inversely track each other) or that have matching voltage waveforms (or waveforms that directly track each other).

Figure 6:
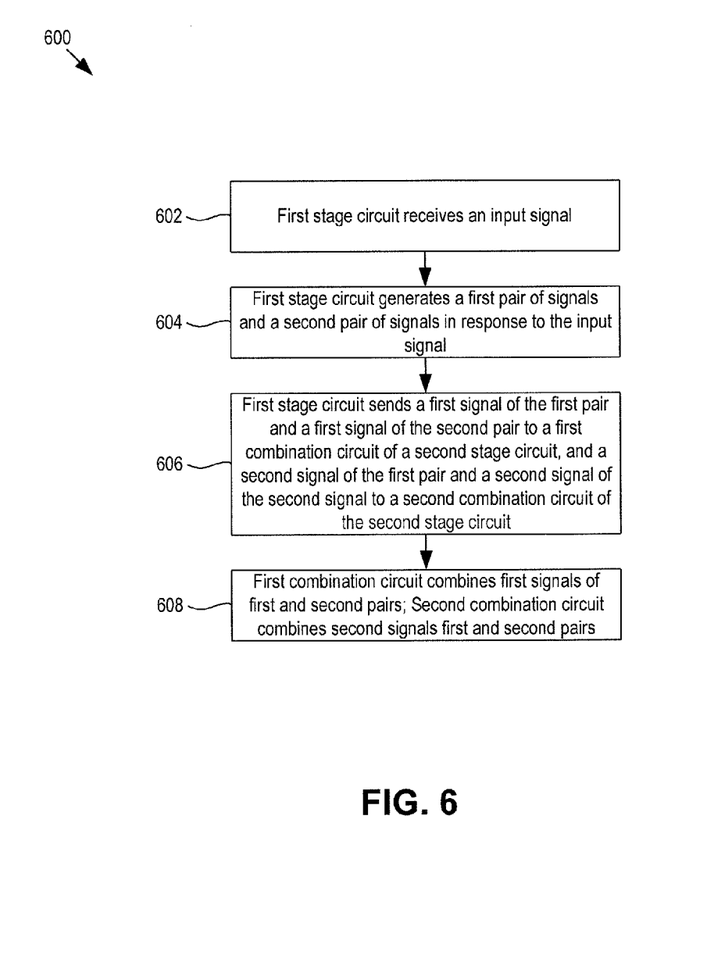
FIG. 6 is a flow chart of an example method of generating a pair of output signals.

FIG. 6 shows a flow chart of an example method 600 of generating a pair of output signals with a circuit system. At block 602, a first stage circuit of the circuit system, such as the first stage circuit 104 of FIG. 1, may receive an input signal. In some example methods, the input signal that the first stage circuit receives may have been inverted by or otherwise processed by an input stage circuit, such as the first inverter 106 of FIG. 1, before the input signal is received by the first stage circuit. For other example methods, the input signal may be supplied directly to the first stage circuit without first being received and processed by an input stage circuit.

At block 604, the first stage circuit may generate a first pair of signals and a second pair of signals in response to the input signal received at block 602. In some example methods, the first pair of signals may be a complementary pair of signals and/or the second pair of signals may be a complementary pair of signals. In addition or alternatively, the first pair of signals may include an early-transitioning signal and a late-transitioning signal and/or the second pair of signals may include an early-transitioning signal and a late-transitioning signal.

In some example methods, a chain of two inverters, such as the inverter chain including the fourth inverter 112 and the fifth inverter 114 of FIG. 1, may be configured to generate the first pair of signals. In addition or alternatively, a combination of a pass gate circuit and an inverter, such as the pass gate circuit 116 and the sixth inverter 118 of FIG. 1, may be configured to generate the second pair of signals.

At block 606, the first stage circuit may send a first signal of the first pair and a first signal of the second pair to a first combination circuit of a second stage circuit, and may send a second signal of the first pair and a second signal of the second pair to a second combination circuit of the second stage circuit. In some example methods, the first signal of the first pair may be the late-transitioning signal of the first pair and the first signal of the second pair may be the early-transitioning signal of the second pair. In addition or alternatively, the second signal of the first pair may be the early-transitioning signal of the first pair, and the second signal of the second pair may be the late-transitioning signal of the second pair. In addition or alternatively, the first signal of the first pair and the first signal of the second pair may be in-phase with each other, or at least the first signal of the second pair may be closer to being in-phase with the first signal of the first pair than the second signal of the second pair. In addition or alternatively, the second signal of the first pair and the second signal of the second pair may be in-phase with each other, or at least the second signal of the second pair may be close to being in-phase with the second signal of the first pair than the first signal of the second pair.

At block 608, the first combination circuit may combine the first signal of the first pair and the first signal of the second pair to generate a first signal of a third pair of signals, and the second combination circuit may combine the second signal of the first pair and the second signal of the second pair to generate a second signal of the third pair of signals. In some example methods, the first combination circuit may be a first coupled inverter, such as one that includes the seventh inverter 120 and the eighth inverter 122 of FIG. 1. The first coupled inverter may be configured to combine the first signal of the first pair and the first signal of the second pair by inverting each of the first signal of the first pair and the first signal of the second pair to generate respective inverted outputs, and combining the inverted outputs at an output node of the first coupled inverter. In addition, in some example methods, the second combination circuit may be a second coupled inverter, such as one that includes the ninth inverter 122 and the tenth inverter 124 of FIG. 1. The second coupled inverter may be configured to combine the second signal of the first pair and the second signal of the second pair by inverting each of the second signal of the first pair and the second signal of the second pair to generate respective inverted outputs, and combining the inverted outputs at an output node of the second coupled inverter.

In some example methods, the third pair of signals generated with the second stage circuit may be output as the pair of output signals of the circuit system. For other example methods, the third pair of signals may be provided from the second stage circuit to an output stage circuit, which may process the third pair of signals to generate and output the pair of output signals. For example, the output stage circuit may include a first inverter, such as the second inverter 108 of FIG. 1, that inverts one of the third pair of signals to generate one of the pair of output signals, and a second inverter, such as the third inverter 110 of FIG. 1, that inverts the other of the third pair of signals to generate the other of the pair of output signals.

Figure 7:
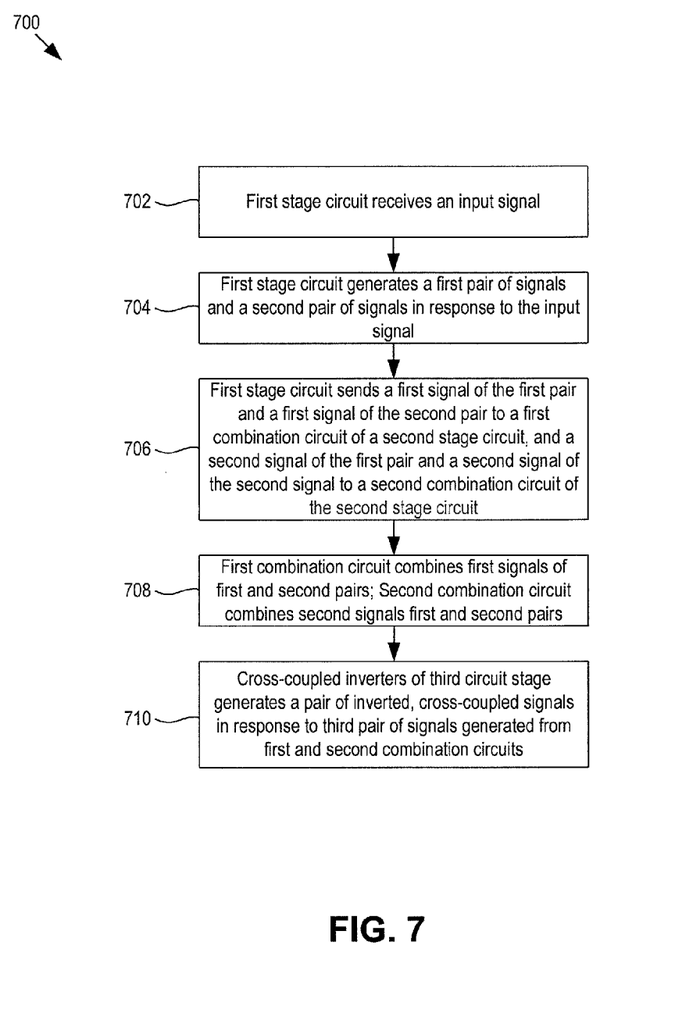
FIG. 7 is a flow chart of another example method of generating a pair of output signals.

FIG. 7 shows a flow chart of an example method 700 of generating a pair of output signals with a circuit system. At block 702, a first stage circuit of the circuit system, such as the first stage circuit 104 of FIG. 5, may receive an input signal. In some example methods, the input signal that the first stage circuit receives may have been inverted by or otherwise processed by an input stage circuit, such as the first inverter 106 of FIG. 5, before the input signal is received by the first stage circuit. For other example methods, the input signal may be supplied directly to the first stage circuit without first being received and processed by an input stage circuit.

At block 04, the first stage circuit may generate a first pair of signals and a second pair of signals in response to the input signal received at block 702. In some example methods, the first pair of signals may be a complementary pair of signals and/or the second pair of signals may be a complementary pair of signals. In addition or alternatively, the first pair of signals may include an early-transitioning signal and a late-transitioning signal and/or the second pair of signals may include an early-transitioning signal and a late-transitioning signal.

In some example methods, a chain of two inverters, such as the inverter chain including the fourth inverter 112 and the fifth inverter 114 of FIG. 5, may be configured to generate the first pair of signals. In addition or alternatively, a combination of a pass gate circuit and an inverter, such as the pass gate circuit 116 and the sixth inverter 118 of FIG. 5, may be configured to generate the second pair of signals.

At block 706, the first stage circuit may send a first signal of the first pair and a first signal of the second pair to a first combination circuit of a second stage circuit, and may send a second signal of the first pair and a second signal of the second pair to a second combination circuit of the second stage circuit. In some example methods, the first signal of the first pair may be the late-transitioning signal of the first pair and the first signal of the second pair may be the early-transitioning signal of the second pair. In addition or alternatively, the second signal of the first pair may be the early-transitioning signal of the first pair, and the second signal of the second pair may be the late-transitioning signal of the second pair. In addition or alternatively, the first signal of the first pair and the first signal of the second pair may be in-phase with each other, or at least the first signal of the second pair may be closer to being in-phase with the first signal of the first pair than the second signal of the second pair. In addition or alternatively, the second signal of the first pair and the second signal of the second pair may be in-phase with each other, or at least the second signal of the second pair may be close to being in-phase with the second signal of the first pair than the first signal of the second pair.

At block 708, the first combination circuit may combine the first signal of the first pair and the first signal of the second pair to generate a first signal of a third pair of signals, and the second combination circuit may combine the second signal of the first pair and the second signal of the second pair to generate a second signal of the third pair of signals. In some example methods, the first combination circuit may be a first coupled inverter, such as one that includes the seventh inverter 120 and the eighth inverter 122 of FIG. 5. The first coupled inverter may be configured to combine the first signal of the first pair and the first signal of the second pair by inverting each of the first signal of the first pair and the first signal of the second pair to generate respective inverted outputs, and combining the inverted outputs at an output node of the first coupled inverter. In addition, in some example methods, the second combination circuit may be a second coupled inverter, such as one that includes the ninth inverter 122 and the tenth inverter 124 of FIG. 5. The second coupled inverter may be configured to combine the second signal of the first pair and the second signal of the second pair by inverting each of the second signal of the first pair and the second signal of the second pair to generate respective inverted outputs, and combining the inverted outputs at an output node of the second coupled inverter.

At block 710, a third circuit stage that includes a pair of cross-coupled inverters, such as the third circuit stage 502 including the eleventh inverter 504 and the twelfth inverter 506, may receive the third pair of signals and generate a pair of inverted, cross-coupled signals. In some example methods, an input of a first inverter of the cross-coupled inverter pair may be coupled to an output node of the first combination circuit. The first inverter may receive the first signal of the third pair and invert the first signal to generate a first cross-coupled inverted signal. In addition, an input of a second inverter of the cross-coupled inverter pair may be coupled to an output node of the second combination circuit. The second inverter may receive the second signal of the third pair and invert the second signal to generate a second cross-coupled inverted signal.

In some example methods, the pair of cross-coupled inverted signals generated with the third stage circuit may be output as the pair of output signals of the circuit system. For other example methods, the pair of cross-coupled inverted signals may be sent from the third stage circuit to an output stage circuit, which may process the pair of cross-coupled inverted signals to generate and output the pair of output signals. For example, the output stage circuit may include a first inverter, such as the second inverter 108 of FIG. 5, that inverts one of the pair of cross-coupled inverted signals to generate one of the pair of output signals, and a second inverter, such as the third inverter 110 of FIG. 5, that inverts the other of the pair of cross-coupled inverted signals to generate the other of the pair of output signals.

The above-described circuits and related methods can be implemented in and/or applicable for any systems, apparatuses, devices, or circuits that generate a pair of output signals based on an input signal, especially those where it is desirable for the pair of output signals to have minimum skew and/or minimum duty cycle distortion between them. One example application is non-volatile memory systems in which a controller communicates with one or more non-volatile memory dies. The pair of output signals may be or may be converted into a pair of clock signals or strobe signals that the controller sends to the non-volatile memory dies. The pair of clock or strobe signals may be complementary signals, balanced signals, or a combination thereof. The controller may send the pair of clock or strobe signals to the memory dies via a channel that includes a pair of clock or strobe lines. The controller may be configured to send the pair of clock or strobe signals to the memory dies in addition to and/or along with one or more data signals, which the controller may send on one or more data lines of the channel. Circuitry on the memory dies may use the pair of clock or strobe signals to determine when to latch onto the data signals.

The example circuit 100 of FIG. 1 and/or the example circuit 500 of FIG. 5 may be configured as a de-skew circuit that may be and/or may be part of a clock or strobe signal generation circuit. The de-skew circuit may be configured in between a core portion or section of the controller and the channel over which the controller communicates the pair of clock or strobe signals, the data signals, and control signals, with the memory dies. The core of the controller may send a clock or strobe signal to the circuit 100 or the circuit 500. The clock or strobe signal received from the core may be the input signal $V_{IN}$. In response to the clock or strobe signal from the core, the circuit 100 or the circuit 500 may generate the pair of clock or strobe signals that are sent to the memory dies.

For non-volatile memory applications, such as described, sending the pair of clock or strobe signals with minimal skew and/or duty cycle distortion may be important or critical to ensure as high of signal integrity as possible and to help minimize the amount of errors during programming data to the memory dies and reading data from the memory dies. Communicating the pair of clock or strobe signals with minimal skew and/or duty cycle distortion may maintain consistent and sufficiently wide pulse widths of the pair of clock or strobe signals for successful and accurate latching of the data signals. Improved de-skew circuits that provide minimized skew and/or duty cycle distortion between the pair of clock or strobe signals for non-volatile memory applications may be especially important for double data rate (DDR) applications, where data or other information is transmitted on both the rising and falling edges of the data signals. Additionally, improved de-skew circuits are of increasing importance as data rates for the interface between the controller and the memory dies increase, such as those in accordance with Toggle Mode (TM) 800 and above; as the number of memory dies in a given memory system or memory device increases; and for wide ranges or variations of process, voltage, temperature (PVT) conditions to which the memory systems or devices may be subjected. The example circuit 100 of FIG. 1 and the example circuit 500 of FIG. 5 may be example de-skewer circuits suitable for such non-volatile memory applications with higher data rates, larger numbers of dies, and wide ranges of PVT conditions.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

I claim:

1. A circuit comprising:
a first stage circuit to:
receive an input signal; and
in response to the input signal:
generate a first pair of signals comprising a first early-transitioning signal and a first late-transitioning signal; and
generate a second pair of signals comprising a second early-transitioning signal and a second late-transitioning signal; and
a second stage circuit to:
input the first early-transitioning signal into a first inverter and the second late-transitioning signal into a second inverter to generate a first combined signal; and
input the first late-transitioning signal into a third inverter and the second early-transitioning signal into a fourth inverter to generate a second combined signal.

2. The circuit of claim 1, wherein the first stage circuit comprises:
a chain of inverters to generate the first pair of signals; and
a pass gate and an inverter to generate the second pair of signals.

3. The circuit of claim 2, wherein:
the input signal is input into a fifth inverter of the chain of inverters to obtain the first early-transitioning signal;
the first early-transitioning signal is input into a sixth inverter of the chain of inverters to obtain the first late-transitioning signal;
the input signal is passed through the pass gate to obtain the second early-transitioning signal; and
the second early-transitioning signal is input into a seventh inverter of the chain of inverters to obtain the second late-transitioning signal.

4. The circuit of claim 1, wherein the first inverter and the second inverter form a first
coupled inverter circuit such that the first inverter inverts:
the first early-transitioning signal to generate an inverted first early-transitioning signal, the second inverter inverts the second late-transitioning signal to generate an inverted second late-transitioning signal, and the inverted first early-transitioning signal and the inverted second late-transitioning signal are combined at an output of the first inverter and the second inverter to generate the first combined signal.

5. The circuit of claim 1, wherein the third inverter and the fourth inverter form
second coupled inverter circuit such that the third inverter inverts:
the first late-transitioning signal to generate an inverted first late-transitioning signal, the fourth inverter inverts the second early-transitioning signal to generate an inverted second early-transitioning signal, the inverted first late-transitioning signal and the inverted second early-transitioning signal are combined at an output of the third inverter and the fourth inverter to generate the second combined signal.

6. The circuit of claim 1, further comprising:
a third stage circuit comprising a pair of cross-coupled inverters to:
receive the first combined signal and the second combined signal; and
generate a pair of cross-coupled signals based on the first combined signal, the second combined signal, and cross-coupling of the pair of cross-coupled inverters.

7. The circuit of claim 1, wherein transistors of the second stage circuit are sized according to relative transition timing of the first early-transitioning signal, the first late-transitioning signal, the second early-transitioning signal, and the second late-transitioning signal.

8. The circuit of claim 1, wherein the first pair of signals are complementary signals and the second pair of signals are complementary signals.

9. The circuit of claim 1, wherein the first combined signal and the second combined signal are complementary signals.

10. A circuit comprising:
a first inverter circuit comprising:
a first inverter to invert a first signal of a first pair of complementary signals to obtain a first inverted signal; and
a second inverter to invert a second signal of a second pair of complementary signals to obtain a second inverted signal,
wherein an output of the first inverter is coupled with the output of the second inverter to combine the first inverted signal and the second inverted signal to generate a first combined signal; and
a second inverter circuit comprising:
a third inverter to invert a third signal of the first pair of complementary signals to obtain a third inverted signal; and
a fourth inverter to invert a fourth signal of the second pair of complementary signals to obtain a fourth inverted signal,
wherein the output of the third inverter is coupled with the output of the fourth inverter to combine the third inverted signal and the fourth inverted signal to generate a second combined signal.

11. The circuit of claim 10, further comprising:
a fifth inverter to invert an input signal and output the first signal of the first pair of complementary signals; and
a pass gate to output the input signal as the fourth signal of the second pair of complementary signals,
wherein the first signal and the fourth signal are uncoupled from each other.

12. The circuit of claim 10, further comprising:
a fifth inverter to invert the first signal and output the third signal of the first pair of complementary signals; and
a sixth inverter to invert the fourth signal and output the second signal of the second pair of complementary signals,
wherein the second signal and the third signal are uncoupled from each other.

13. The circuit of claim 10, further comprising:
a fifth inverter to invert the first combined signal and generate a first output signal; and a sixth inverter to invert the second combined signal and generate a second output signal.

14. The circuit of claim 10, further comprising:
a pair of cross-coupled inverters to:
receive the first combined signal and the second combined signal; and
generate a pair of cross-coupled signals based on the first combined signal, the second combined signal, and cross-coupling of the pair of cross-coupled inverters.

15. The circuit of claim 10, wherein transistors of the first inverter circuit and the second inverter circuit are sized according to relative transition timing of the first pair of complementary signals and the second pair of complementary signals.

16. The circuit of claim 10, wherein the first signal of the first pair of complementary signals and the second signal of the second pair of complementary signals are in phase with each other, and wherein the third signal of the first pair of complementary signals and the fourth signal of the second pair of complementary signals are in phase with each other.

17. A circuit comprising:
a first stage circuit to:
receive an input signal; and
in response to the input signal, generate a first set of signals and a second set of signals at a plurality of output nodes, wherein the plurality of output nodes are uncoupled from each other; and
a second stage circuit to:
receive a first signal from the first set of signals and a second signal from the second set of signals at a first set of coupled inverters to generate a first combined output signal; and
receive a third signal from the first set of signals and a fourth signal from the second set of signals at a second set of coupled inverters to generate a second combined signal,
wherein the first combined output signal and the second combined output signal are complementary output signals.

18. The circuit of claim 17, wherein the first stage circuit comprises:
a chain of inverters to generate the first set of signals; and
a pass gate and an inverter to generate the second pair of signals.

19. The circuit of claim 17, wherein the first set of coupled inverters of the second stage circuit comprises a first inverter to receive the first signal and a second inverter to receive the second signal to generate the first combined output signal at an output of the first inverter and an output of the second inverter, and wherein the second set of coupled inverters comprises a third inverter to receive the third signal and a fourth inverter to receive the fourth signal to generate the second combined output signal at an output of the third inverter and an output of the fourth inverter.

20. The circuit of claim 19, wherein transistors of the first inverter, the second inverter, the third inverter, and the fourth inverter are sized according to relative transition timing of the first set of signals and the second set of signals.

* * * * *